(12) United States Patent
Chonan et al.

(10) Patent No.: US 10,681,840 B2
(45) Date of Patent: Jun. 9, 2020

(54) COOLING SYSTEM AND ELECTRONIC APPARATUS

(71) Applicant: LENOVO (SINGAPORE) PTE. LTD., Singapore (SG)

(72) Inventors: Tsutomu Chonan, Yokohama (JP); Takuroh Kamimura, Yokohama (JP); Takateru Adachi, Yokohama (JP); Atsushi Ohyama, Yokohama (JP); Shogo Akiyama, Yokohama (JP)

(73) Assignee: LENOVO (SINGAPORE) PTE. LTD., Singapore (SG)

(*) Notice: Subject to any disclaimer, the term of this patent is extended or adjusted under 35 U.S.C. 154(b) by 164 days.

(21) Appl. No.: 16/022,656

(22) Filed: Jun. 28, 2018

(65) Prior Publication Data

US 2019/0313548 A1 Oct. 10, 2019

(30) Foreign Application Priority Data

Apr. 4, 2018 (JP) .................................. 2018-072551

(51) Int. Cl.
*H05K 7/20* (2006.01)
*G01K 13/00* (2006.01)

(52) U.S. Cl.
CPC ..... *H05K 7/20209* (2013.01); *H05K 7/20154* (2013.01); *G01K 13/00* (2013.01)

(58) Field of Classification Search
CPC ............ H05K 7/20209; H05K 7/20154; H01L 23/473
USPC .................................................. 165/288, 290
See application file for complete search history.

(56) References Cited

U.S. PATENT DOCUMENTS

| 4,262,737 | A | * | 4/1981 | Faillace | G05D 23/1917 165/267 |
| 5,848,282 | A | * | 12/1998 | Kang | G06F 1/206 713/323 |
| 8,082,069 | B2 | * | 12/2011 | Koshiyama | G05D 23/1931 165/287 |
| 9,516,787 | B2 | * | 12/2016 | Iwama | H05K 7/20209 |
| 2006/0266510 | A1 | * | 11/2006 | Nobashi | G05D 23/1934 165/287 |

(Continued)

FOREIGN PATENT DOCUMENTS

JP 10011176 A 1/1998
JP 200259204 A 9/2004

(Continued)

*Primary Examiner* — Devon Russell
(74) *Attorney, Agent, or Firm* — Shimokaji IP (57) ABSTRACT

The present invention aims to reduce noise derived from an operation sound of a fan while maintaining cooling capacity of the fan. A cooling system includes a fan which is disposed in a chassis in which a CPU which is exemplified as a heating element is housed, one temperature sensor which is disposed in the chassis, another temperature sensor which is disposed at a position which is different from a position of the one temperature sensor, and a fan control unit which drives the fan in a case where one temperature, which is based on a measured value of one temperature sensor, is at least a first threshold value or in a case where another temperature, which is based on a measured value of the other temperature sensor, is at least a second threshold value which is set to a value lower than the first threshold value.

6 Claims, 9 Drawing Sheets

(56) References Cited

U.S. PATENT DOCUMENTS

| | | | |
|---|---|---|---|
| 2016/0181849 A1* | 6/2016 | Govindaraj | H02J 7/025 |
| | | | 320/108 |
| 2018/0146574 A1* | 5/2018 | Chen | H01L 41/053 |
| 2019/0212174 A1* | 7/2019 | Krishnan | G01D 21/02 |

FOREIGN PATENT DOCUMENTS

| JP | 2007226617 A | 9/2007 |
| --- | --- | --- |
| JP | 2009238020 A | 10/2009 |
| JP | 2014060349 A | 4/2014 |
| JP | 2014134905 A | 7/2014 |
| JP | 2007122276 A | 5/2017 |
| JP | 6190513 B1 * | 8/2017 |
| JP | 2018077561 A | 5/2018 |

* cited by examiner

| ROTATION STAGE | TURBO | HIGH | MIDDLE | LOW |
|---|---|---|---|---|
| ROTATION NUMBER | R4' | R3' | R2' | R1' |
| TEMPERATURE THRESHOLD VALUE | T_th4' | T_th3' | T_th2' | T_th1' |

COOLING SYSTEM AND ELECTRONIC APPARATUS

TECHNICAL FIELD

The present invention relates to a cooling system and an electronic apparatus equipped with the cooling system.

BACKGROUND

Electric and electronic components such as a board (a substrate) on which various LSI chips such as a CPU and so forth are loaded, storage devices such as a hard disk drive (HDD), a solid-state drive (SSD) and so forth, a power source device, input/output devices and so forth are loaded on an electronic apparatus such as, for example, a computer system and so forth, and housed in a chassis of the electronic apparatus and the respective electric and electronic components generate heat with operations thereof. A fixed temperature range is defined in a specification for these electric and electronic components in order to ensure favorable operations thereof. Accordingly, the electronic apparatus is equipped with a cooling fan which discharges heat generated in the chassis to the outside of the chassis in order to maintain the temperature in the chassis within the fixed temperature range.

When the cooling fan operates, an operation sound is generated. A user may hear this operation sound as noise. Therefore, a technique of reducing the operation sound of the cooling fan while maintaining sufficient cooling capacity of the cooling fan is proposed. For example, in Japanese Patent Application Laid-Open No. 2007-122276, there is disclosed a technique of making it possible to reduce an unpleasant feeling of the user caused by the operation sound of the cooling fan and to suppress unnecessary power consumption by stopping rotation of the cooling fan in a case where it is decided that a falling speed of the temperature in a computer chassis remains constant in a predetermined set temperature range.

SUMMARY OF THE INVENTION

The temperature in the chassis varies from place to place. For example, there is a temperature difference between the vicinity of a heating element and a surface of the chassis that the user touches. In addition, for example, a temperature of a CPU (Central Processing Unit) frequently changes because an amount of heat generated from the CPU changes following a fluctuation in load on the CPU. On the other hand, the temperature on the surface of the chassis changes comparatively gently in comparison with a temperature change of the CPU. Although the temperature change in the vicinity of the heating element is different from the temperature change on the chassis surface that the user touches in property, fan rotation number control in which such a difference in property between the temperature change in the vicinity of the heating element and the temperature change on the chassis surface is taken into consideration has not been conducted so far. In addition, when the cooling fan operates, the operation sound is generated, and the operation sound is increased with increasing the rotation number. Therefore, in a case where the control of the rotation number of the cooling fan is not appropriately conducted, a noise issue which is derived from the operation sound may occur and the noise may give the unpleasant feeling to the user.

The present invention has been made in view of such circumstances as described above and aims to provide a cooling system which is capable of reducing the noise derived from the operation sound of the cooling fan while maintaining the cooling capacity of the cooling fan and an electronic apparatus which includes the above-described cooling system.

A cooling system according to the first aspect of the present invention includes a fan which is disposed in a chassis in which a heating element is housed, a first temperature sensor which is disposed in the chassis, a second temperature sensor which is disposed at a position which is different from a position of the first temperature sensor, and a fan control unit which drives the fan in a case where a first temperature, which is based on a measured value of the first temperature sensor, is at least a first threshold value or in a case where a second temperature, which is based on a measured value of the second temperature sensor, is at least a second threshold value which is set to a value lower than the first threshold value.

A cooling system according to the second aspect of the present invention includes a fan which is disposed in a chassis in which a heating element is housed, a temperature sensor which is disposed in the chassis, a fan control unit which controls the fan, and a connection sensing unit which senses that an external device is connected to the chassis, in which the fan control unit has a rotation number command generation section which generates a rotation number command for the fan by using a measured value of the temperature sensor, and a command invalidation section which invalidates the rotation number command which is generated by the rotation number command generation section for a predetermined period of time in a case where it is sensed that the external device is connected to the chassis.

An electronic apparatus according to the third aspect of the present invention includes the above-described cooling system.

The present invention has such an effect that it becomes possible to reduce the noise derived from the operation sound of the fan while maintaining the cooling capacity of the fan.

DETAILED DESCRIPTION OF THE INVENTION

In the following, a cooling system according to each embodiment of the present invention, where the cooling system according to the present invention is applied to a Laptop personal computer (an electronic apparatus) will be described with reference to the drawings. Incidentally, the cooling system according to each embodiment of the present invention is also applicable to other various electronic apparatuses such as a desk-top PC, a work station, audio equipment, video equipment, communication equipment, medical equipment and so forth, and so is not limited to the Laptop personal computer.

First Embodiment

Figure 1:
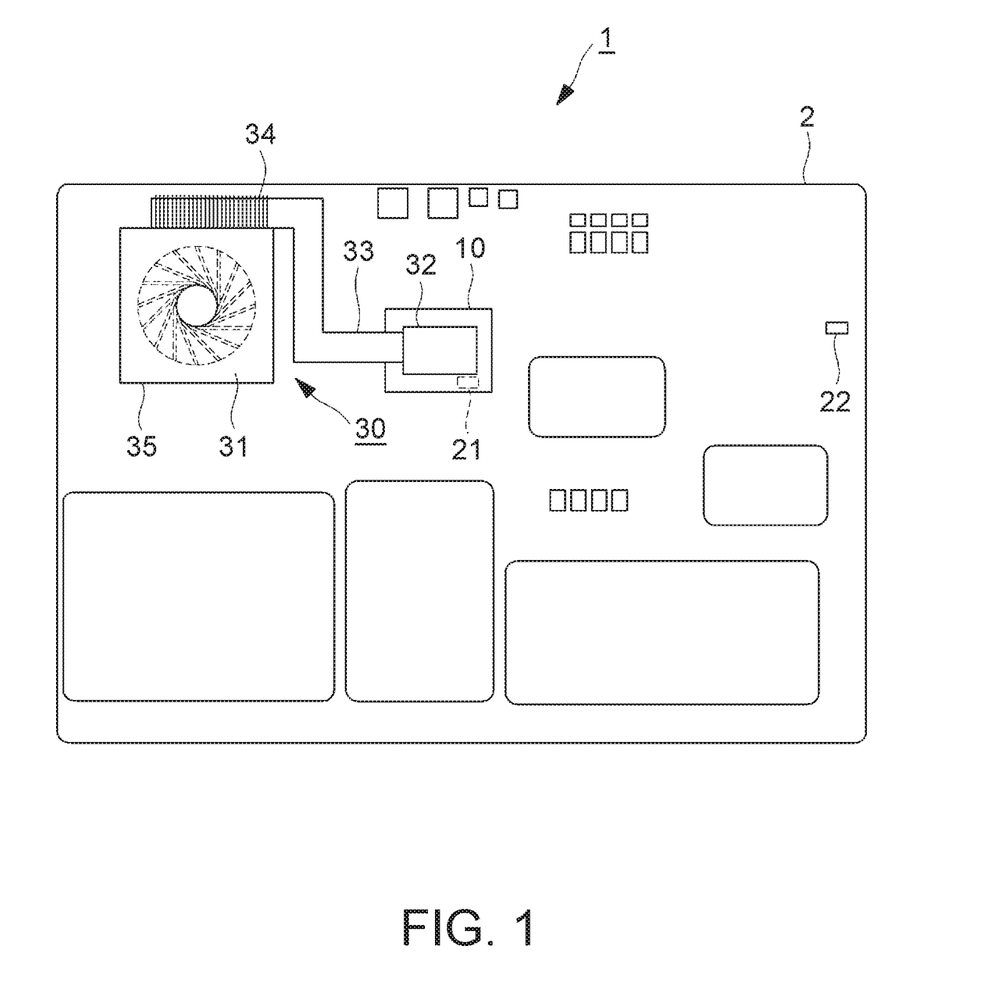
FIG. 1 is a plan view schematically illustrating one example of the inside of a chassis of a Laptop PC according to a first embodiment of the present invention.

FIG. 1 is a plan view schematically illustrating one example of the inside of a chassis 2 of a Laptop personal computer (hereinafter, referred to as the "Laptop PC") 1 according to the first embodiment of the present invention. A CPU 10, a cooling unit 30, a mother board (not illustrated) onto which many electronic components and so forth are mounted and so forth are disposed in the chassis 2 of the Laptop PC 1.

The CPU 10 controls the whole of the Laptop PC 1. Specifically, the CPU 10 executes various programs under control of an OS (Operating System). For example, the CPU 10 is configured by including a cache which is a high-speed operation memory adapted to reduce a total time taken for making access to a main memory (illustration thereof is omitted) by temporarily storing very limited codes and data to which access is frequently made. The CPU 10 is interconnected with various hardware configurations which are loaded on the Laptop PC 1 via a bus (illustration thereof is omitted).

The cooling unit 30 includes, for example, a cooling fan (hereinafter, referred to as the "fan") 31, a heat receiving element 32, a heat pipe 33 which is connected with the heat receiving element 32, and a set of fins 34 which is connected with the heat pipe 33. The heat receiving element 32 is disposed, for example, on the CPU 10. Heat generated from the CPU 10 is thermally transported to the set of fins 34 via the heat receiving element 32 and the heat pipe 33. The fan 31 is, for example, a centrifugal fan and a plurality of blades which is attached to a shaft of a fan motor 40 (see FIG. 2) is housed in a thin-type chamber 35 of the fan 31. The set of fins 34 is directly attached to the chamber 35 in such a manner that its position aligns with an opening formed in a side face of the chamber 35. When the fan 31 rotates, the ambient air which is taken into the chamber 35 through suction ports (illustration thereof is omitted) formed in upper and lower surfaces of the chamber 35 passes between the mutually adjacent fins 34 and is emitted to the outside through an exhaust port (illustration thereof is omitted) which is formed in a side face of the chassis 2 and thereby cooling of the inside of the chassis 2 is performed. In addition, an intake port (not illustrated) which is adapted to take the ambient air into the chassis 2 is formed in the chassis 2. Incidentally, the above-described configuration of the cooling unit 30 is one example and a well-known configuration may be appropriately adopted.

A plurality of temperature sensors 21 and 22 is installed in the chassis 2. Incidentally, although in the first embodiment, a case where the two temperature sensors 21 and 22 are installed in the chassis 2 is exemplified, the number of the temperature sensors to be installed is not limited to two and three or more temperature sensors may be installed. The temperature sensor 21 and the temperature sensor 22 are installed at mutually different positions and, for example, the temperature sensor (a first temperature sensor) 21 is installed at a position which is closer to the CPU 10 which is exemplified as a heating element than the temperature sensor (a second temperature sensor) 22 is to the CPU 10. For example, the temperature sensor 21 is an embedded-type sensor which is embedded in the CPU 10 and measures the temperature of the CPU 10. The temperature sensor 22 is installed, for example, in the vicinity of the set of fins 34 or in the vicinity of a surface of the chassis 2. Measured values of the temperature sensors 21 and 22 are used for monitoring temperatures of their corresponding devices and for controlling the fan 31 for the purpose of maintaining a temperature on the surface of the chassis 2 within a predetermined value range.

Figure 2:
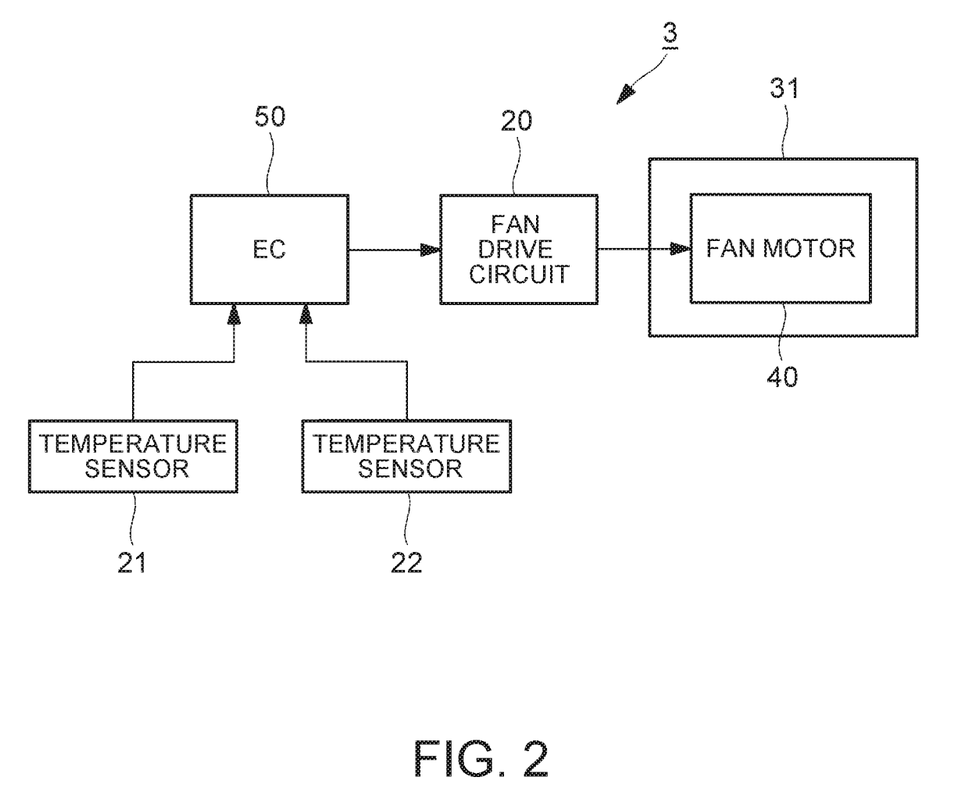
FIG. 2 is a diagram illustrating one example of a schematic configuration of a cooling system according to a first embodiment of the present invention.

FIG. 2 is a diagram illustrating one example of a schematic configuration of a cooling system 3 that the Laptop PC 1 includes. As illustrated in FIG. 2, the cooling system 3 includes the fan 31, a fan drive circuit 20, an embedded controller (a fan control unit) 50, and the plurality of temperature sensors 21 and 22. The fan 31 includes the fan motor 40.

The fan drive circuit 20 controls a rotation number of the fan motor 40 that the fan 31 includes on the basis of a rotation number command which is output from the embedded controller (hereinafter, referred to as the "EC") 50. The EC 50 is, for example, a micro-computer which is configured by a CPU, a ROM (Read Only Memory) which stores firmware, a RAM (Random Access Memory) adapted to execute the firmware and so forth. Further, the EC 50 includes a plurality of A/D input terminals, a plurality of D/A output terminals, a timer, digital input/output terminals and so forth. The fan drive circuit 20, the temperature sensors 21 and 22 and so forth are connected to the EC 50 via the above-described input/output terminals. The EC 50 is able to execute a program relating to management of an operating environment in the Laptop PC 1 without exerting an excessive load on the above-described CPU 10 (see FIG. 1).

Figure 3:
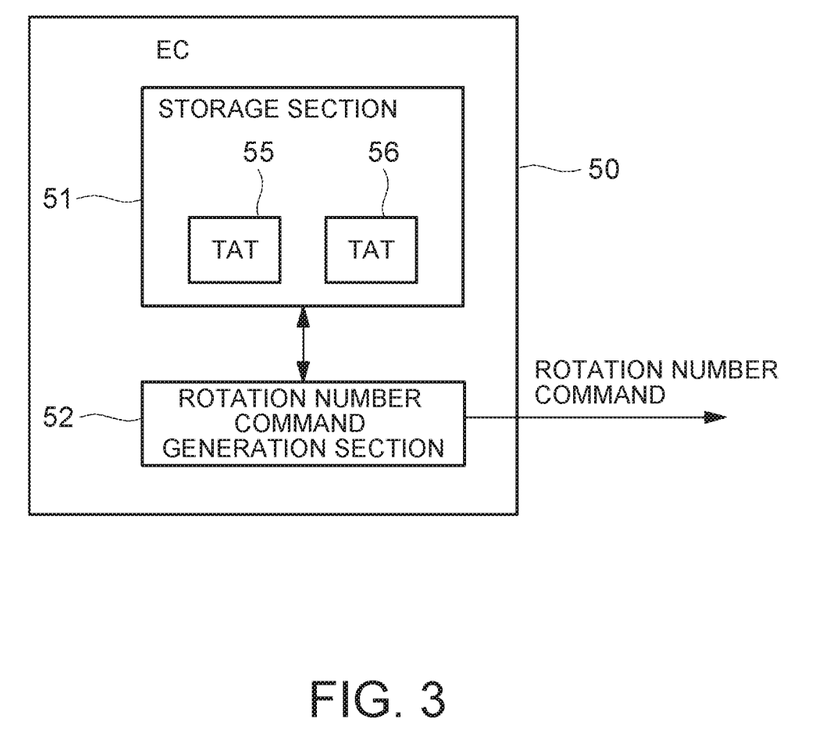
FIG. 3 is a functional block diagram illustrating one example of functions that an embedded controller according to the first embodiment of the present invention can have.

FIG. 3 is a functional block diagram illustrating one example of functions that the above-described EC 50 has. As illustrated in FIG. 3, the EC 50 includes a storage section 51 and a rotation number command generation section 52 which generates a rotation number command used to control the rotation number of the fan 31 on the basis of temperatures (a first temperature and a second temperature) which are based on the measured values of the temperature sensors 21 and 22 as main configurations. Functions of the storage section 51 and the rotation number command generation section 52 are mainly implemented by executing a fan control program which is stored in the ROM by using the CPU that the EC 50 includes.

Figure 4:
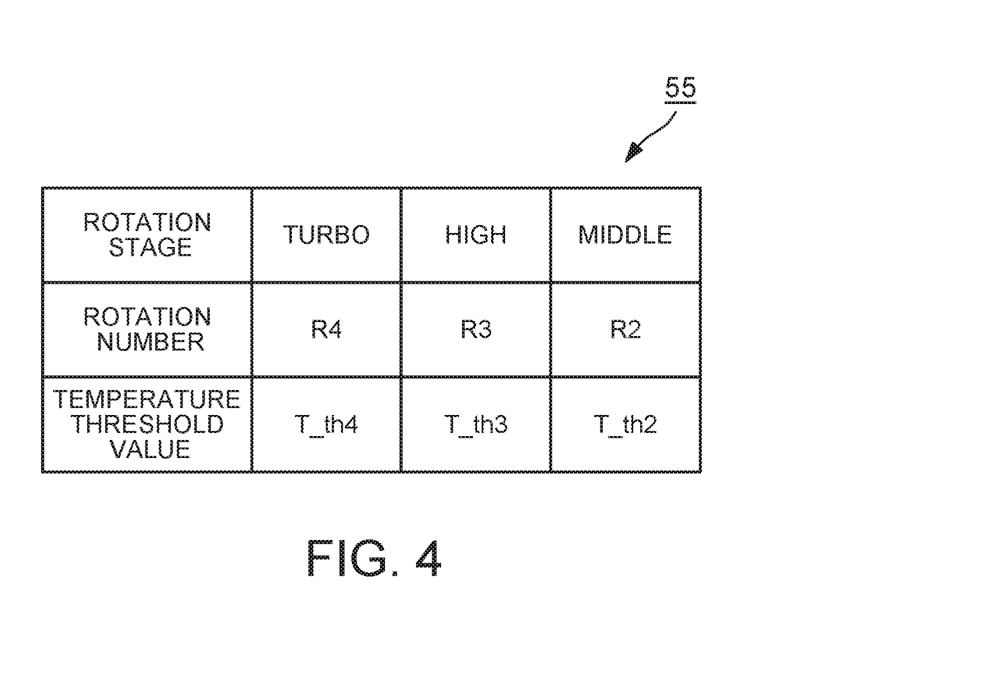
FIG. 4 is a diagram illustrating one example of one thermal action table according to the first embodiment of the present invention.
Figure 5:
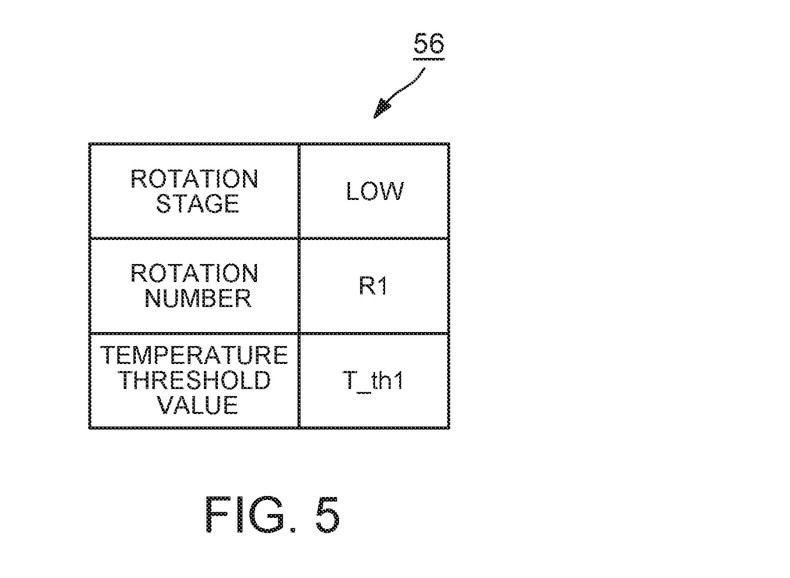
FIG. 5 is a diagram illustrating one example of another thermal action table according to the first embodiment of the present invention.

A thermal action table (temperature and rotation number information) in which temperature threshold values and rotation numbers are listed in one-to-one correspondence is stored in the storage section 51. As the thermal action table (hereinafter, referred to as "TAT"), a TAT 55 used to compare each temperature threshold value with the measured value of the temperature sensor 21 and a TAT 56 used to compare each temperature threshold value with the measured value of the temperature sensor 22 are provided in the storage section 51. FIG. 4 illustrates one example of the TAT 55 and FIG. 5 illustrates one example of the TAT 56. Incidentally, in the first embodiment, description will be made by exemplifying a case where each of the measured values of the temperature sensors 21 and 22 is compared with each of the temperature threshold values as they are. Alternatively, for example, a temperature estimated value may be obtained by arithmetic operations on the basis of the measured values of the temperature sensors 21 and 22 and the rotation number of the fan 31 may be controlled by using the temperature estimated value.

As illustrated in FIG. 4 and FIG. 5, rotation stages ranging from a low-speed (turbo-mode-speed) rotation stage to a highest-speed rotation stage are defined in the TAT 55 and a low-speed rotation stage is defined in the TAT 56. In the first embodiment, in a case where a condition that a measured value T1 of the temperature sensor 21 is at least a temperature threshold value T_th2 (a first threshold value) which corresponds to a middle-speed rotation stage or a measured value T2 of the temperature sensor 22 is at least a temperature threshold value T_th1 (a second threshold value) which corresponds to the low-speed rotation stage is satisfied, the fan 31 is driven.

For example, in a case where the measured value T1 of the temperature sensor 21 is less than the temperature threshold value T_th2 (the first threshold value) and the measured value T2 of the temperature sensor 22 is at least the temperature threshold value T_th1 (the second threshold value), the fan 31 is driven at a rotation number R1.

In addition, for example, in a case where the measured value T1 of the temperature sensor 21 is at least the temperature threshold value T_th2 (the first threshold value) and less than a temperature threshold value T_th3 and the measured value T2 of the temperature sensor 22 is less than the temperature threshold value T_th1, the fan 31 is driven at a rotation number R2.

In addition, for example, in a case where the measured value T1 of the temperature sensor 21 is at least the temperature threshold value T_th2 (the first threshold value) and less than the temperature threshold value T_th3 and the measured value T2 of the temperature sensor 22 is at least the temperature threshold value T_th1, the fan 31 is driven at a higher rotation number, that is, at the rotation number R2 in this case. In addition, in the TAT 55 and the TAT 56, the temperature threshold values T_th1 to T_th4 may have hysteresis when the rotation number is increased and when the rotation number is decreased.

Figure 6:
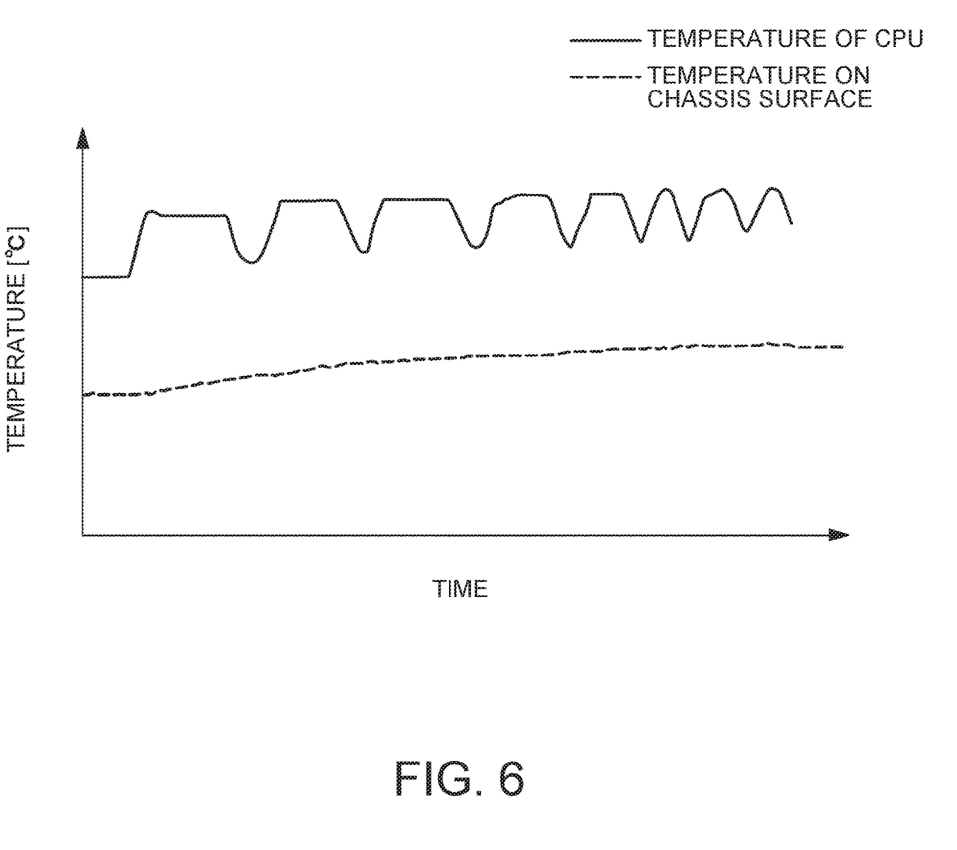
FIG. 6 is a diagram illustrating one example of a relation between a temperature of a CPU and a temperature on a surface of a chassis in a case where a load on the CPU fluctuates.

Here, one example of a relation between the temperature of the CPU 10 and the temperature on the surface of the chassis 2 in a case where the load on the CPU 10 fluctuates is illustrated in FIG. 6. In FIG. 6, the horizontal axis indicates a time and the vertical axis indicates a temperature. As illustrated in FIG. 6, while the temperature of the CPU 10 comparatively frequently fluctuates in accordance with the load on the CPU 10, the temperature on the surface of the chassis 2 is gently increased/decreased with heat generation from the heating element such as the CPU 10 and so forth in the chassis 2. In this way, the temperature changes have the property that a temperature change in the vicinity of the heating element is different from a temperature change on the surface of the chassis 2 that the user touches. Then, in such a case, when trying to control the fan 31 on the basis of only one parameter (for example, the temperature of the CPU 10) leaving the difference in property between the above-described temperature changes out of consideration, there is the possibility that the fan 31 may be operated unnecessarily and unnecessary noise is generated. Therefore, in the first embodiment, the rotation number of the fan 31 is controlled by evaluating the temperature on the surface of the chassis 2 which comparatively gently changes and the temperature of the CPU 10 which would instantaneously change with the fluctuation in load on the CPU 10 as a possibility by using different temperature threshold values.

In addition, in regard to the respective temperature threshold values, for example, there is the possibility that the user may touch the surface of the chassis 2 and therefore the temperature threshold value T_th1 may be set to a temperature at which the user begins to feel the heat. On the other hand, a temperature at which capacity degradation of the CPU 10 occurs due to temperature rising of the CPU 10 is a temperature which is higher than the temperature at which the user begins to feel the heat. Accordingly, the temperature threshold value T_th2 at which the fan 31 is operated on the basis of the temperature of the CPU 10 may be set to a value which is higher than the temperature threshold value T_th1 and is lower than a temperature at which the capacity of the CPU 10 begins to be degraded. In addition, the above-described temperature threshold value T_th2 may be set to a value which is larger than a peak value of the temperature of the CPU 10 which temporarily rises, for example, in a case where the external device is connected to an external connection terminal (illustration thereof is omitted) which is provided on the chassis 2. Even in a case where the temperature of the CPU 10 temporarily rises due to connection of the external device to the external connection terminal, it becomes possible to avoid driving of the fan 31 which is induced by temperature rising of the CPU 10 by setting the temperature threshold value T_th2 to the above-described value.

The rotation number command generation section 52 (see FIG. 3) sets the rotation number of the fan 31 by using the TAT 55 and the TAT 56 which are stored in the storage section 51 and the measured values T1 and T2 of the temperature sensors 21 and 22, generates a rotation number command according to the set rotation number and outputs the rotation number command so generated to the fan drive circuit 20.

Figure 7:
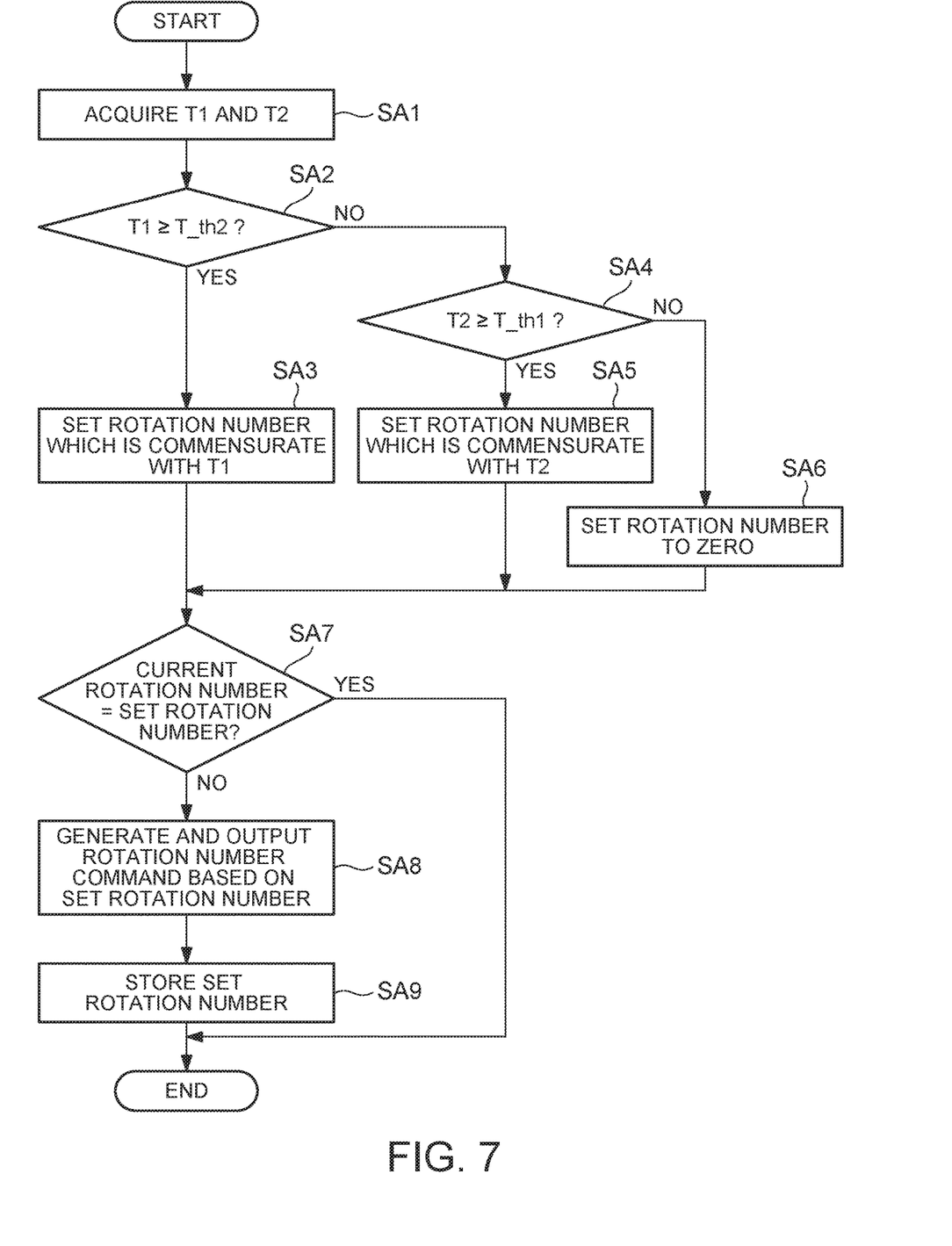
FIG. 7 is a flowchart illustrating one example of a processing procedure of a method of controlling a fan according to the first embodiment of the present invention.

A method of controlling the fan 31 using the cooling system 3 according to the first embodiment will be described with reference to FIG. 7. FIG. 7 is a flowchart illustrating one example of a procedure of the method of controlling the fan 31 performed by the cooling system 3 according to the first embodiment. The EC 50 repetitively executes the fan controlling method illustrated in FIG. 7 at predetermined time intervals, and thereby a controlling of the rotation number of the fan 31 which is based on the measured values of the temperature sensors 21 and 22 is achieved.

First, the EC 50 acquires the measured values T1 and T2 of the temperature sensors 21 and 22 (SA1). Then, the EC 50 decides whether the measured value T1 of the temperature sensor 21 is at least the temperature threshold value T_th2 with reference to the TAT 55 (SA2). In a case where an affirmative decision is made as a result of execution of a process in SA2 (SA2: YES), the EC 50 sets the rotation number which is commensurate with the measured value T1 on the basis of the TAT 55 (SA3). For example, when the measured value T1 is at least the temperature threshold value T_th2 and is less than the temperature threshold value T_th3, the EC 50 sets the rotation number R2, when the measured value T1 is at least the temperature threshold value T_th3 and is less than the temperature threshold value T_th4, the EC 50 sets a rotation number R3, and when the measured value T1 is at least the temperature threshold value T_th4, the EC 50 sets a rotation number R4.

On the other hand, in a case where a negative decision is made in step SA2 (SA2: NO), the EC 50 decides whether the measured value T2 of the temperature sensor 22 is at least the temperature threshold value T_th1 with reference to the TAT 56 (SA4). In a case where the affirmative decision is made as a result of execution of a process in SA4 (SA4: YES), the EC 50 sets the rotation number which is commensurate with the measured value T2 on the basis of the TAT 56 (SA5). On the other hand, in a case where the negative decision is made in step SA4 (SA4: NO), the EC 50 sets the rotation number of the fan 31 to zero (SA6).

Then, the EC 50 decides whether the rotation number which is set in SA3, SA5 or SA6 coincides with the currently set rotation number (SA7). In a case where the rotation numbers coincide with each other as a result of execution of a process in SA7 (SA7: YES), the rotation number is not changed and therefore execution of processing of interest is terminated without outputting the rotation number command. On the other hand, in step SA7, in a case where the rotation numbers are different from each other (SA7: NO), the EC 50 generates the rotation number command which is based on the set rotation number and outputs the generated rotation number command to the fan drive circuit 20 (SA8). Then, the EC 50 stores the set rotation number into a predetermined storage area of the storage section 51 as the current rotation number (SA9) and thereby terminates execution of the processing of interest.

The fan drive circuit 20 supplies a predetermined voltage to the fan motor 40 on the basis of the rotation number command which is output from the EC 50 and thereby controls the rotation number of the fan motor 40. In addition, the fan drive circuit 20 maintains control of the fan motor 40 which is based on the current rotation number command until a fresh rotation number command is input from the EC 50. Incidentally, in the flowchart illustrated in FIG. 7, description is made by exemplifying a case where no hysteresis is added to the temperature threshold values T_th1 to T_th4 when the rotation number is increased and when the rotation number is decreased. However, in a case where the hysteresis is added to the temperature threshold values T_th1 to T_th4, control which is commensurate with the hysteresis may be performed appropriately.

As described above, according to the cooling system 3 according to the first embodiment and the electronic apparatus which includes the cooling system 3, the plurality of the temperature sensors 21 and 22 is disposed at mutually different positions in the chassis 2 and the fan 31 is controlled by using the temperature threshold values T_th2 and T_th1 which are set in correspondence with the measured values T1 and T2 of the temperature sensors 21 and 22 respectively. Setting of the respective appropriate temperature threshold values in which the difference in property between the temperature change of the electronic component such as the CPU 10 which is disposed in the chassis 2 and the place-dependent temperature change (for example, the temperature change on the surface) of the chassis 2 is taken into consideration becomes possible by providing the temperature threshold values T_th2 and T_th1 respectively for the measured values T1 and T2. Thereby, it becomes possible to maintain the temperature in the chassis 2 and the temperature on the surface of the chassis 2 within an appropriate temperature range. Further, it is possible to suppress unnecessary driving of the fan 31 and therefore it becomes possible to reduce the unpleasant feeling of the user which is induced by noise generation.

Second Embodiment

A cooling system 5 according to the second embodiment of the present invention and an electronic apparatus which includes the cooling system 5 will be described with reference to the drawings. In the following, the same numerals are assigned to the configurations which are the same as those in the above-described first embodiment, description thereof is omitted and points which are different from those in the first embodiment will be described.

Figure 8:
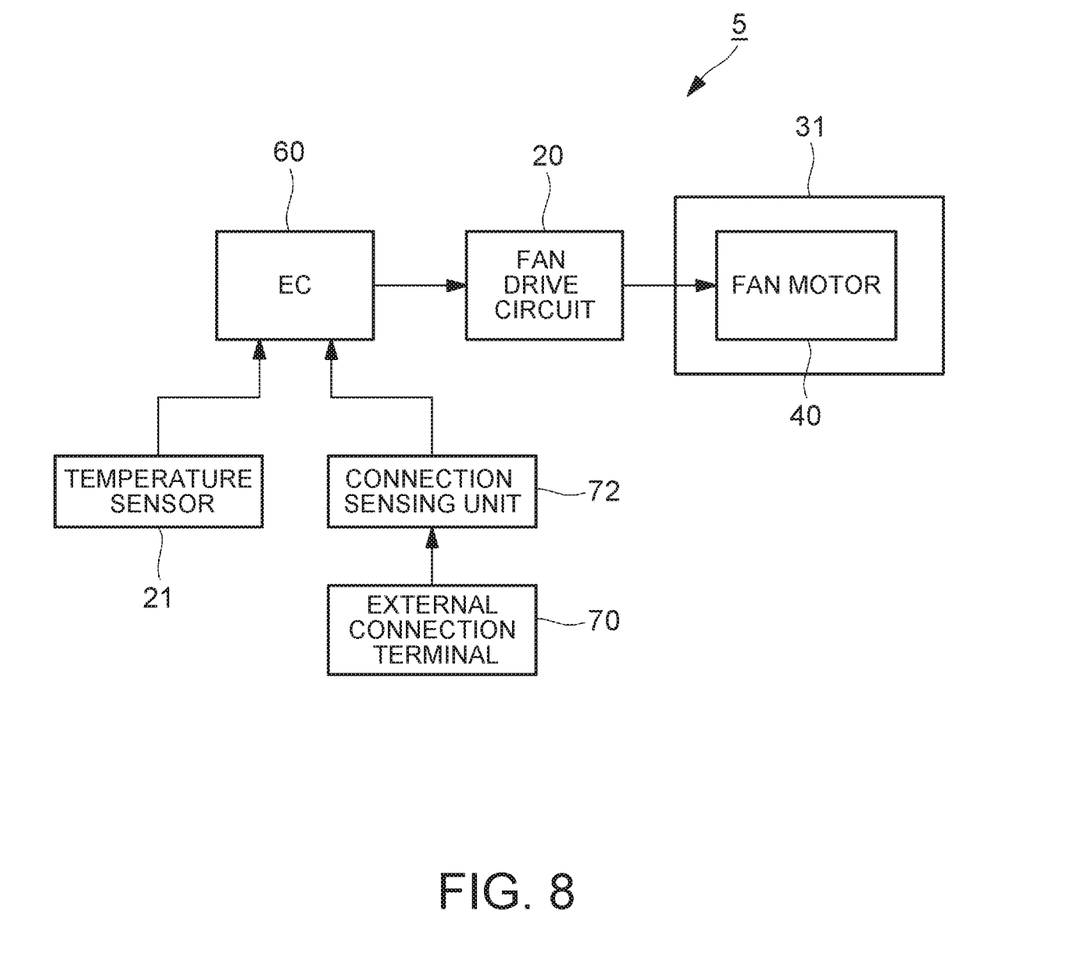
FIG. 8 is a diagram illustrating one example of a schematic configuration of a cooling system according to a second embodiment of the present invention.

FIG. 8 is a diagram illustrating one example of a schematic configuration of the cooling system 5 according to the second embodiment. As illustrated in FIG. 8, the cooling system 5 includes the fan 31, the fan drive circuit 20, an embedded controller (a fan control unit) 60 (hereinafter, referred to as the "EC"), the temperature sensor 21, and a connection sensing unit 72 which senses that the external device is connected to an external connection terminal 70 which is provided on the chassis 2 and that the external device which is connected to the external connection terminal 70 is disconnected from the external connection terminal 70 as main configurations. The external connection terminal 70 is a terminal to which the external devices such as a USB (Universal Serial Bus) memory, a video device such as a projector and so forth, an external display and so forth are connected. A USB terminal, an HDMI (High-Definition Multimedia Interface) (a registered trademark) terminal, a DVI (Digital Visual Interface) terminal and so forth may be given as examples of the external connection terminal 70.

The connection sensing unit 72 senses that the external device is connected to/disconnected from the external connection terminal 70 by an electrical or physical method, or by a method other than the electrical or physical method. Incidentally, a function of sensing connection/disconnection of the external device to/from the external connection terminal 70 is loaded on a general electronic apparatus such as the Laptop PC and so forth as a standard function and therefore detailed description on the connection sensing unit 72 is omitted. The connection sensing unit 72 outputs a connection sensing signal to the EC 60 when sensing that the external device is connected to the external connection terminal 70 and outputs a disconnection sensing signal to the EC 60 when sensing that the external device is disconnected (detached) from the external connection terminal 70.

The EC 60 outputs the rotation number command which is based on the measured value of the temperature sensor 21 to the fan drive circuit 20 and controls so as to maintain the current rotation number command for a predetermined period of time in a case where the connection sensing signal or the disconnection sensing signal is input from the connection sensing unit 72. Thereby, a fan controlled state which is obtained immediately before connection of the external device to the external connection terminal 70 is sensed is maintained for the predetermined period of time.

Figure 9:
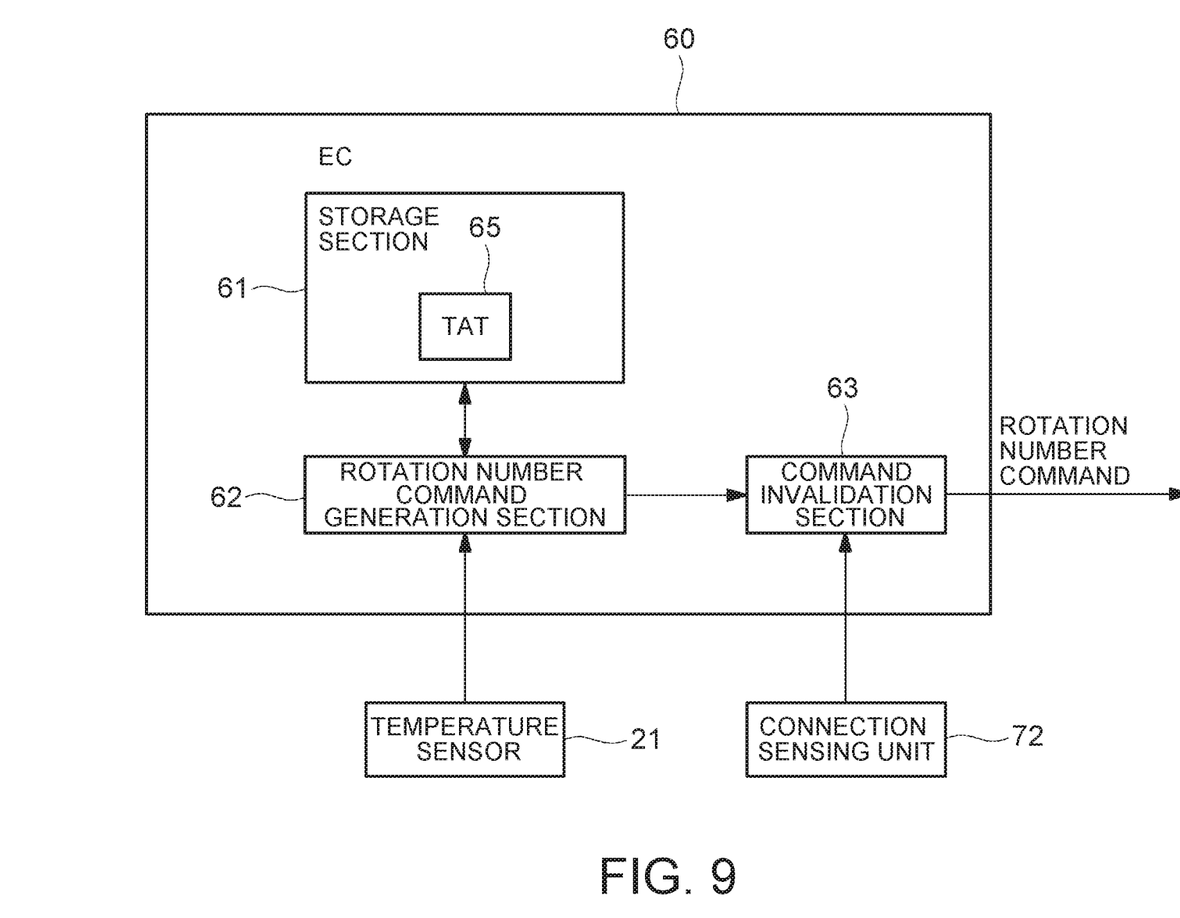
FIG. 9 is a functional block diagram illustrating one example of functions that an embedded controller according to the second embodiment of the present invention can have.
Figure 10:
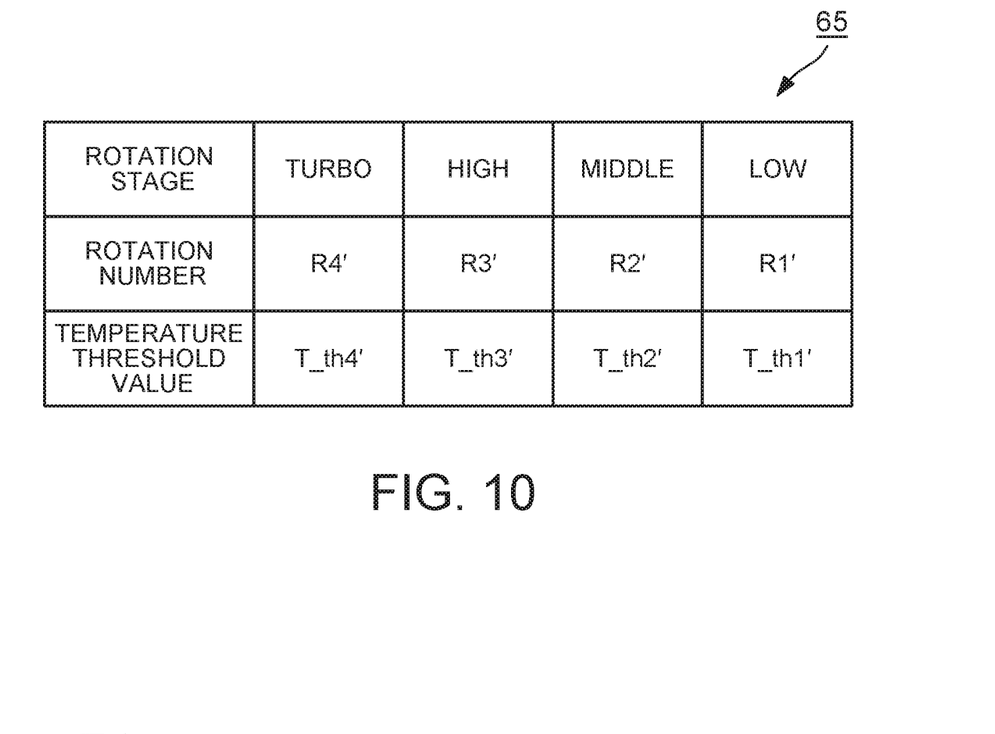
FIG. 10 is a diagram illustrating one example of a thermal action table according to the second embodiment of the present invention.

FIG. 9 is a functional block diagram illustrating one example of functions that the EC 60 according to the second embodiment has. As illustrated in FIG. 9, the EC 60 includes a storage section 61, a rotation number command generation section 62 and a command invalidation section 63, as main sections. The functions of these sections are mainly implemented by executing a fan control program which is stored in a ROM (Read Only Memory) using a CPU that the EC 60 includes. A thermal action table (temperature and rotation number information) 65 in which temperatures and rotation numbers are listed in one-to-one correspondence is stored in the storage section 61. FIG. 10 illustrates one example of the thermal action table (hereinafter, referred to as the "TAT") 65. As illustrated in FIG. 10, rotation stages ranging from a low-speed rotation stage to a highest-speed rotation stage are defined and temperature threshold values T_th1' to T_th4' which correspond to the rotation stages ranging from the low-speed rotation stage to the highest-speed rotation stage respectively are defined in the TAT 65. In the second embodiment, in a case where the measured value of the temperature sensor 21 is at least the temperature threshold value T_th1' which corresponds to the low-speed rotation stage, the fan 31 is operated. In addition, in the TAT 65, the temperature threshold values T_th1' to T_th4' may have hysteresis when the rotation number is increased and when the rotation number is decreased.

The rotation number command generation section 62 sets the rotation number of the fan 31 which is commensurate with the temperature by using the TAT 65 which is stored in the storage section 61 and the measured value of the temperature sensor 21, generates a rotation number command which is commensurate with the set rotation number and outputs the generated rotation number command to the fan drive circuit 20. For example, in a case where the measured value T1 of the temperature sensor 21 is at least the temperature threshold value T_th1' and is less than the temperature threshold value T_th2', the rotation number command generation section 62 generates a rotation number command on the basis of which the fan 31 is driven at a rotation number Rt. In addition, in a case where the measured value T1 of the temperature sensor 21 is at least the temperature threshold value T_th2' and is less than the temperature threshold value T_th3', the rotation number command generation section 62 generates a rotation number command on the basis of which the fan 31 is rotated (driven) at a rotation number R2'. In a case where the measured value T1 of the temperature sensor 21 is at least the temperature threshold value T_th3' and is less than the temperature threshold value T_th4', the rotation number command generation section 62 generates a rotation number command on the basis of which the fan 31 is rotated (driven) at a rotation number R3'. In a case where the measured value T1 of the temperature sensor 21 is at least the temperature threshold value T_th4', the rotation number command generation section 62 generates a rotation number command on the basis of which the fan 31 is rotated (driven) at a rotation number R4'. Incidentally, a method of setting the rotation number in the second embodiment is one example and a well-known technique may be appropriately adopted.

The rotation number command which is generated by the rotation number command generation unit 62 is output to the command invalidation section 63. The connection sensing signal and the disconnection sensing signal which are output from the above-described connection sensing unit 72 are input into the command invalidation section 63. In a case where the connection sensing signal or the disconnection sensing signal is input from the connection sensing unit 72, the command invalidation section 63 invalidates the rotation number command which is output from the rotation number command generation section 62 for a predetermined period of time (for example, several minutes). Thereby, in a case where the connection sensing signal or the disconnection sensing signal is input, the current rotation number is maintained with no fluctuation of the rotation number of the fan 31 for a predetermined period of time counted from inputting of the connection sensing signal or the disconnection sensing signal.

Figure 11:
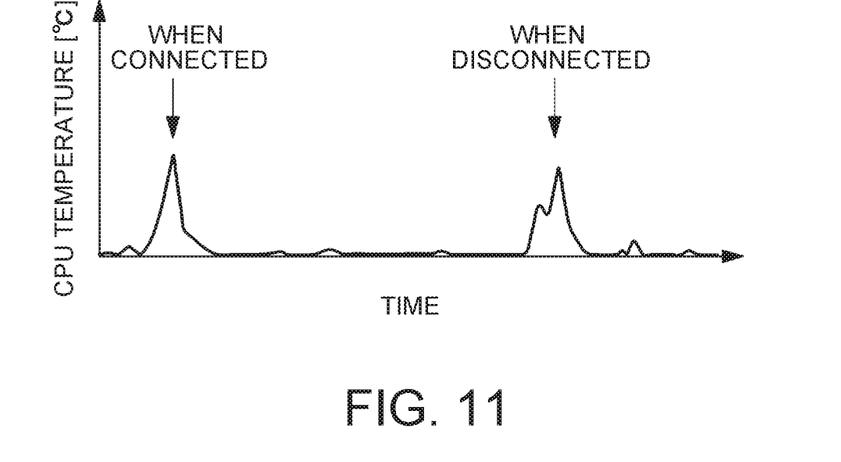
FIG. 11 is a diagram illustrating one example of changes in temperature of the CPU when an external device is connected to the PC and when the external device is disconnected therefrom.

For example, when the external device is connected to the external connection terminal 70 (when connected) and when the external device is released from a state of being connected to the external connection terminal 70 (when disconnected) as illustrated in FIG. 11, the load on the CPU 10 is temporarily increased and the temperature of the CPU 10 temporarily rises accordingly. In general, in a case where the rotation number of the fan 31 is controlled on the basis of only the temperature of the CPU 10, the temperature threshold value T_th1 which is the lowest temperature threshold value used for rotating the fan 31 is set to a value which is smaller than a peak value of the temperature of the CPU 10 which is generated when the external device is connected to/disconnected from the external connection terminal 70. Therefore, instantaneous temperature rising which occurs due to connection of the external device and so forth is captured, and the fan 31 is operated and the noise is generated. On the other hand, in the cooling system 5 according to the second embodiment, when connection/disconnection of the external device is sensed, in other words, in a case where the connection sensing signal or the disconnection sensing signal is input into the EC 60, the rotation number command sent from the rotation number command generation section 62 is invalidated for the predetermined period of time counted from inputting of the connection sensing signal or the disconnection sensing signal and therefore it is possible to suppress operation of the fan 31 or the fluctuation in rotation number of the fan 31 when the external device is connected to/disconnected from the external connection terminal 70. Thereby, it becomes possible to suppress the noise generated from the fan 31 when the external device is connected to/disconnected from the external connection terminal 70.

Although the present invention is described by using the embodiments as above, the technical range of the present invention is not limited to the range described in the above-mentioned embodiments. It is possible to modify or improve the above-described embodiments in a variety of ways within a range not deviating from the gist of the present invention and the embodiments so modified or improved are also included in the technical range of the present invention. In addition, the above-described embodiments may be appropriately combined with each other. For example, some of the functions of the cooling system 5 according to the second embodiment may be added to the cooling system 3 according to the first embodiment. For example, by adding the functions of the connection sensing unit 72 and the command invalidation section 63 to the cooling system 3 according to the first embodiment, the rotation number command may be generated on the basis of, for example, the measured values T1 and T2 of the temperature sensors 21 and 22 and the TATs 55 and 56, and in a case where connection/disconnection of the external device is sensed by the connection sensing unit 72, the rotation number command may be invalidated for a predetermined period of time. Specifically, for example, in the flowchart illustrated in FIG. 7, a process of deciding whether connection/disconnection of the external device is sensed and invalidating the rotation number command generated in step SA8 in a case where the connection/disconnection of the external device is sensed may be added between step SA8 and step SA9. In addition, a process of releasing invalidation of the rotation number command in a case where the predetermined period of time has elapsed after sensing of the connection/disconnection of the external device may be also added.

In addition, in the above-mentioned embodiments, a case where the rotation number of the fan 31 is controlled on the basis of the temperature of the CPU 10 and the temperature on the surface of the chassis 2 is exemplified. However, the temperatures used for controlling the rotation number of the fan 31 are not limited to the temperatures used in the above-mentioned exemplified case. For example, it is possible to use temperatures of main heating elements in the electronic apparatus in place of the temperature of the CPU 10.

In addition, also a flow of the fan controlling method described in the above-mentioned embodiments is one example and an unnecessary step may be deleted, a new step may be added, and the order in which the processes are executed may be changed within the range not deviating from the gist of the present invention.

What is claimed is:

1. A cooling system comprising:
a fan which is disposed in a chassis in which a heating element is housed;
a first temperature sensor which is disposed in the chassis;
a second temperature sensor which is disposed at a position which is different from a position of the first temperature sensor;
a fan control unit configured to drive the fan in response to a first temperature, based on a measured value of the first temperature sensor, reaching at least a first threshold value or a second temperature, based on a measured value of the second temperature sensor, reaching at least a second threshold value which is set to a value lower than the first threshold value; and
a connection sensing unit configured to sense that an external device is connected to the chassis, wherein
the fan control unit has
a rotation number command generation section configured to generate a rotation number command for the fan on the basis of the first temperature and the second temperature, and
a command invalidation section configured to invalidate the rotation number command, which is generated by the rotation number command generation section, for a predetermined period of time in response to sensing that the external device is connected to the chassis.

2. The cooling system according to claim 1, wherein the first temperature sensor is disposed at a position which is closer to the heating element than the position of the second temperature sensor.

3. The cooling system according to claim 1, wherein the heating element is a CPU and the first temperature sensor measures a temperature of the CPU.

4. The cooling system according to claim 1, wherein the second temperature sensor is disposed in the vicinity of a set of fins or in the vicinity of a surface of the chassis.

5. A cooling system comprising:
a fan which is disposed in a chassis in which a heating element is housed;
a temperature sensor which is disposed in the chassis;
a fan control unit configured to control the fan; and
a connection sensing unit configured to sense that an external device is connected to the chassis, wherein
the fan control unit has
a rotation number command generation section configured to generate a rotation number command for the fan by using a measured value of the temperature sensor, and
a command invalidation section configured to invalidate the rotation number command, which is generated by the rotation number command generation section, for a predetermined period of time in response to sensing that the external device is connected to the chassis.

6. A cooling system comprising:
a fan which is disposed in a chassis in which a heating element is housed;
a temperature sensor which is disposed in the chassis;
a fan control unit configured to control the fan; and
a connection sensing unit configured to sense that an external device is released from the chassis, wherein
the fan control unit has
a rotation number command generation section configured to generate a rotation number command for the fan by using a measured value of the temperature sensor, and
a command invalidation section configured to invalidate the rotation number command, which is generated by the rotation number command generation section, for a predetermined period of time in response to sensing that the external device is released from the chassis.

\* \* \* \* \*